(12) United States Patent
Oberschmidt et al.

(10) Patent No.: US 6,724,246 B2
(45) Date of Patent: Apr. 20, 2004

(54) DEMODULATION STRUCTURE AND METHOD

(75) Inventors: Gerald Oberschmidt, Bruchsal (DE); Veselin Brankovic, Esslingen (DE); Dragan Krupezevic, Stuttgart (DE); Tino Konschak, Stuttgart (DE); Thomas Dölle, Stuttgart (DE)

(73) Assignee: Sony International (Europe) GmbH, Berlin (DE)

( * ) Notice: Subject to any disclaimer, the term of this patent is extended or adjusted under 35 U.S.C. 154(b) by 37 days.

(21) Appl. No.: 09/767,124

(22) Filed: Jan. 22, 2001

(65) Prior Publication Data

US 2001/0030575 A1 Oct. 18, 2001

(30) Foreign Application Priority Data

Jan. 24, 2000 (EP) ............................................ 00101381

(51) Int. Cl.[7] .............................. H03D 7/00; H03D 3/00
(52) U.S. Cl. ..................... 329/306; 329/304; 375/324; 375/329; 455/205; 455/208; 455/213; 455/214
(58) Field of Search ................................. 329/304, 306; 375/321, 329; 455/205, 208, 213, 214

Primary Examiner—Arnold Kinkead
(74) Attorney, Agent, or Firm—Frommer Lawrence & Haug LLP; William S. Frommer; Dennis M. Smid

(57) ABSTRACT

The present invention relates to a demodulation structure and method for downconverting and demodulating a digitally modulated signal $S_o$, with a local oscillator means (1; 5; 8) for providing a local oscillator signal $S_{lo}$, a mixer means (2) for mixing said local oscillator signal $S_{lo}$ and said digitally modulated signal $S_0$ in order to obtain a mixed signal, a lowpass filter means (3) for lowpass filtering the mixed signal from the mixer means (2) and an analog-to-digital converting means (4) for converting the filtered signal from the lowpass filter means (3) into a downconverted and demodulated digital signal $S_1$, whereby the local oscillator signal is set in respect to the modulated digital signal so that the downconverted and demodulated digital signal output from the analog-to-digital converting means comprises to serially arranged information parts. The present demodulation structure provides a very simple structure with improved amplitude and phase imbalances.

8 Claims, 8 Drawing Sheets

DEMODULATION STRUCTURE AND METHOD

The present invention relates to a demodulation structure and a method for downconverting and demodulating a modulated digital signal.

Demodulation structures and methods for downconverting and demodulating a digitally modulated signal are known from and used in many different applications, in which signals are transmitted from a transmitting apparatus to a receiving apparatus. The transmission can be either wireless over an air interface or through a wired connection. Of course, the chosen structure and method for downconverting and demodulating a transmitted digitally modulated signal depends essentially on the modulation scheme used on the transmitting side and the transmission medium.

Figure 10:
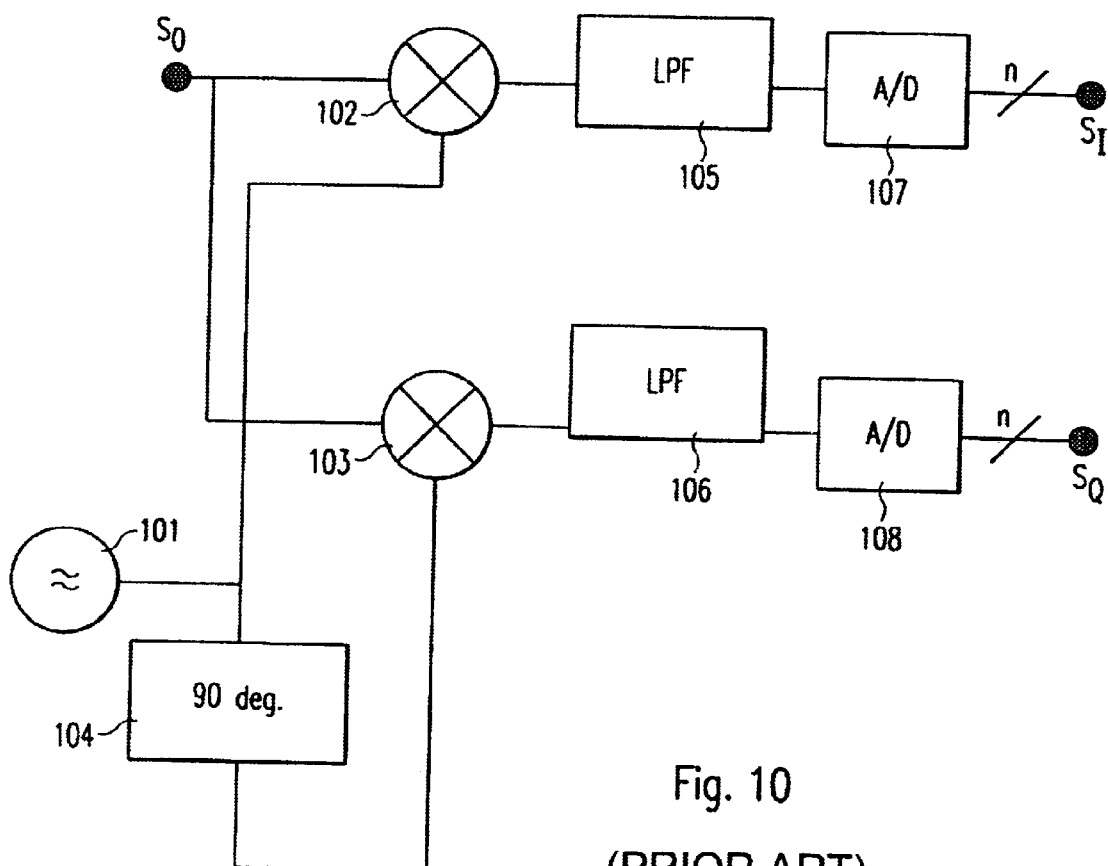

FIG. 10 shows an example for a demodulation structure for downconverting and demodulating a digitally modulated signal $S_0$. The shown demodulation structure is e.g. used for downconverting and demodulating a high frequency signal (RF signal) received in a mobile terminal of a wireless telecommunication system, such as the GSM or the UMTS system. Hereby, a transmitted RF signal is received by an antenna of the mobile terminal and supplied to a RF receiver. The digital RF signal is then supplied to a demodulation structure as e.g. shown in FIG. 10. Another possibility could be to downconvert the RF signal into an intermediate frequency band, whereafter the intermediate signal is further downconverted and demodulated in a structure as shown in FIG. 10.

In wireless telecommunication, usually an I/Q-modulation is used, in which the modulation states can be represented in an I/Q-diagram. The horizontal axis hereby represents the I part, i.e. the part of the signal component which is in phase to the carrier signal, and the vertical axis represents the Q part, i.e. the quadrature component perpendicular to the phase of the carrier signal. The digital information signal is thus transmitted by means of the phase of the carrier signal, whereby the phase of the carrier signal is switched between the different discrete states depending on the symbol to be transmitted. This so-called phase shift key modulation (PSK modulation) is used in many different application areas, very often in combination with amplitude shift keying. The GSM e.g. uses a GMSK modulation (Gaussian minimum shift keying modulation).

Demodulation and downconversion of correspondingly I/Q-modulated signals is e.g. done by analog demodulation structures as shown in FIG. 10 comprising a local oscillator 101, two mixers 102, 103, a 90 degree phase shifter 104, two lowpass filters 105, 106 and two analog-to-digital-converters 107, 108. A local oscillator signal generated in the local oscillator 101 is directly supplied to the first mixer 102 and indirectly supplied to the second mixer 103 via the 90 degree phase shifter 104. In the mixers 102 and 103, the digitally modulated signal $S_0$ is mixed with the corresponding local oscillator signal and the phase shifter local oscillator signal, respectively, so that two separate output streams, one for the in phase (I) part and one for the quadrature phase (Q) part are generated. After further processing in the lowpass filters 105 and 106 and the analog-to-digital converters 107 and 108, the in phase part and the quadrature phase part are obtained in parallel as digital signals $S_I$ and $S_Q$.

The disadvantages of this conventional approach are that the necessary 90 degrees phase shifter is an analog device which is inherently frequency dependent and thus limiting the frequency range of the entire demodulation structure due to the increasing phase and amplitude imbalances. Further, since two parallel output streams are generated, two mixers, two lowpass filters and two A/D-converters are required, so that the entire demodulating structure requires many parts and becomes therefore expensive.

The object of the present invention is therefore to provide a demodulation structure and a method for downconverting and demodulating a digitally modulated signal, which is simple in construction but still effective in operation.

This object is achieved by a demodulation structure for downconverting and demodulating a digitally modulated signal according to claim 1, with a local oscillator means for providing a local oscillator signal, a mixer means for mixing said local oscillator signal and said digitally modulated signal in order to obtain a mixed signal, a lowpass filter means for lowpass filtering said mixer signal from said mixer means, and an analog-to-digital converting means for converting the filtered signal from said lowpass filter means into a downconverted and demodulated digital signal, whereby said local oscillator signal is set in respect to said modulated digital signal so that said downconverted and demodulated digital signal output from said analog-to-digital converting means comprises two serially arranged information parts. The above object is further achieved by a method for downconverting and demodulating a digitally modulated signal according to claim 11.

Compared to the state of the art, the demodulation structure and method are particularly advantageous since the two information parts are obtained serially instead of parallel which allows a very simple construction of the respective devices. This is particularly advantageous in case of an application of the present invention in mobile or portable terminals, like mobile terminals for a wireless telecommunication system, since the overall weight can be significantly reduced. Further, the usually analog phase shifters of the prior art devices can be omitted and therefore the amplitude and the phase imbalances can be essentially reduced. Further, the present invention has the potential to provide demodulation structures and methods with a larger bandwidth of operation as the prior art.

Advantageously, the digitally modulated signal is I/Q-modulated and the two serially arranged information parts comprised in the downconverted and demodulated digital signal are an I-part and a Q-part of the I/Q-modulated digital signal.

Further advantageously, the digitally modulated signal is modulated in a signal band having a center frequency and said local oscillator signal has a center frequency, which is, in respect to the center frequency of the signal band, offset by half of the signal bandwidth of the modulated digital signal.

Alternatively, the local oscillator signal is modulated with at least two modulation states having different phases during the symbol period of the digitally modulated signal. In this case, the two different modulation states may have the same magnitude and a 90 degree phase shift in respect to each other. The demodulation structure according to the present alternative of the present invention may further comprise a modulation control means for supplying a modulation signal to the local oscillator means in order to internally modulate the local oscillator signal with the two modulation states. Alternatively, the demodulation structure of the present alternative of the demodulation structure according to the present invention may comprise an analog circuit means for modulating the local oscillator signal from the local oscillator means with the two modulation states and outputting a modulated local oscillator signal to the mixer means. Hereby, the analog circuit means may comprise a switch means which can be switched between a first branch having a phase shift means and a second branch having no phase shift means, whereby the switch means is switched by means of a control signal with a frequency of at least two times the symbol frequency of the digitally modulated signal.

The present alternative of the demodulation structure according to the present invention may further advantageously comprise a bandpass filter for bandpass filtering the modulated local oscillator signal. Advantageously, the bandpass filter has a center frequency corresponding to the center frequency and a bandwidth corresponding to the bandwidth of the signal band of the digitally modulated signal.

Advantageous features of the method for downconverting and demodulating a modulated digital signal according to the present invention are defined in the subclaims 12 to 20.

Figure 1:
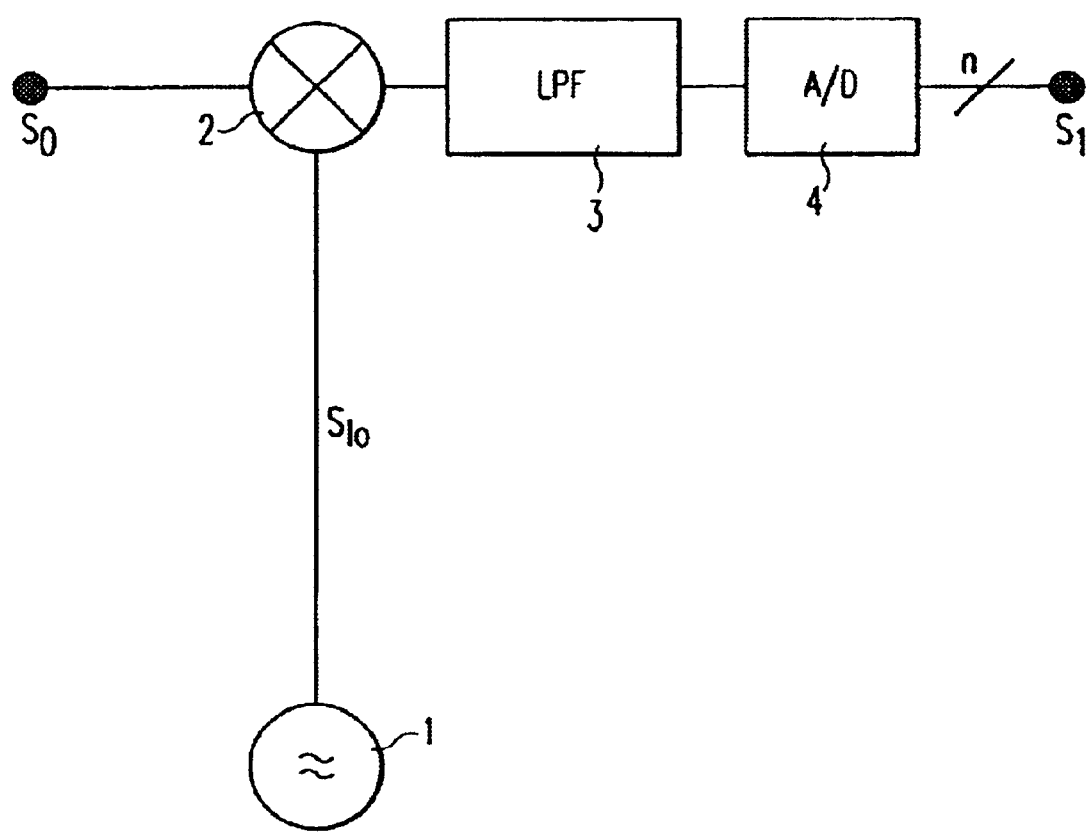
Figure 2:
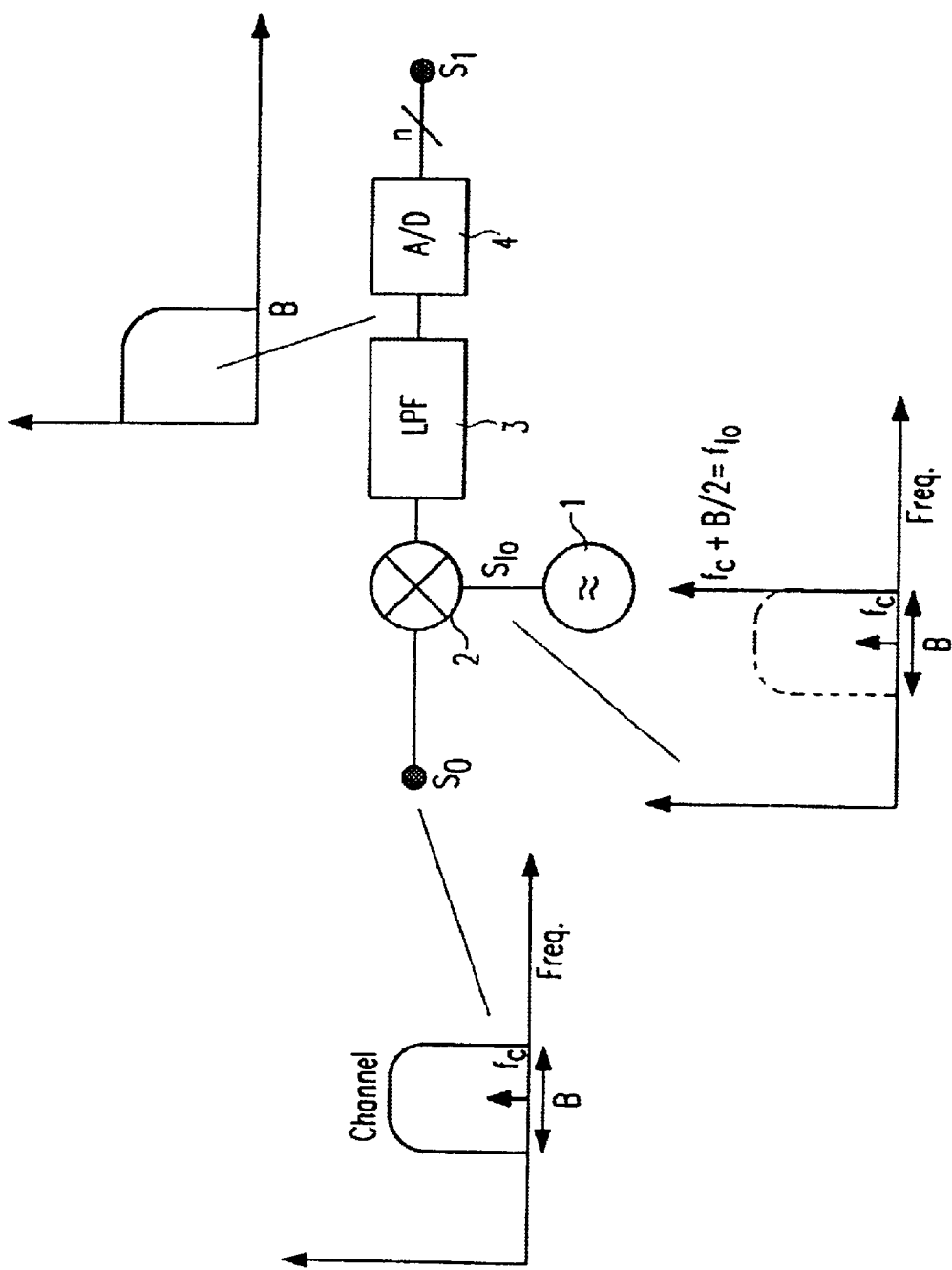
Figure 3:
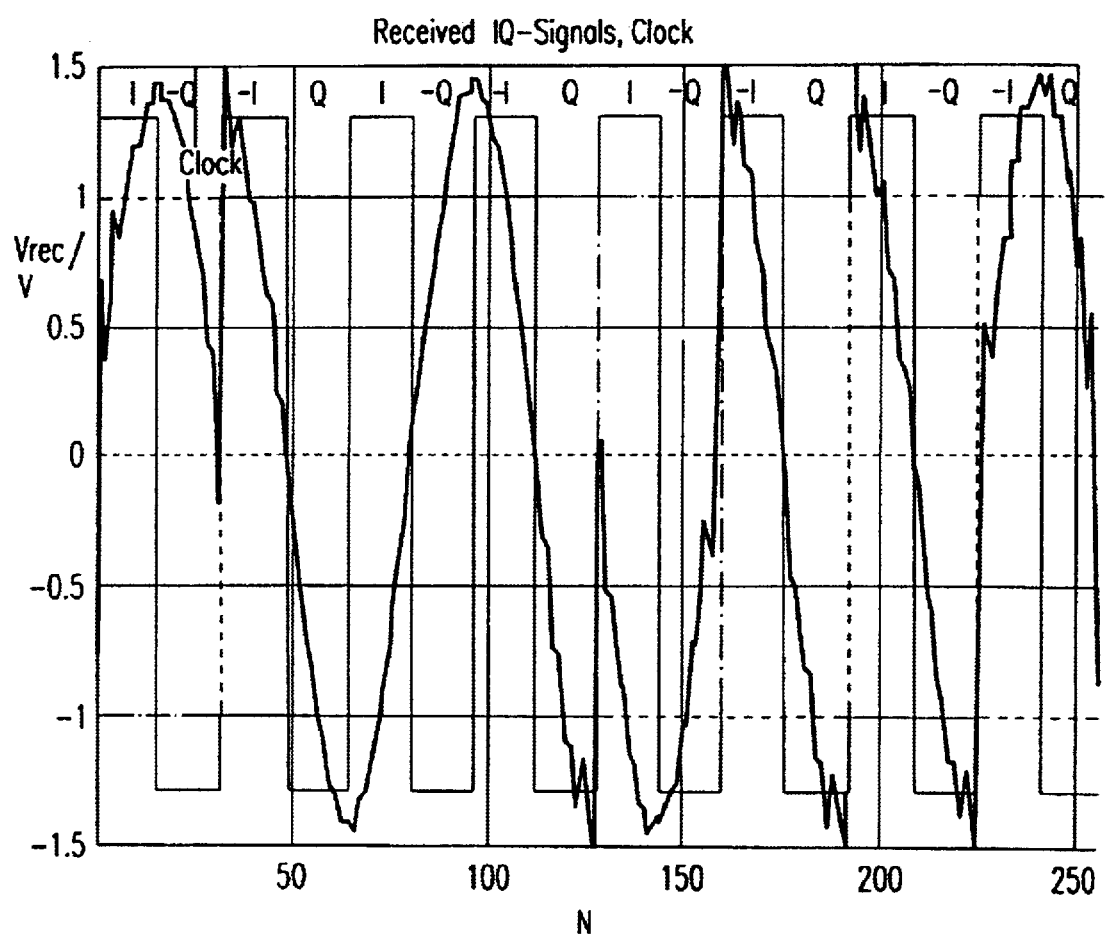
Figure 4:
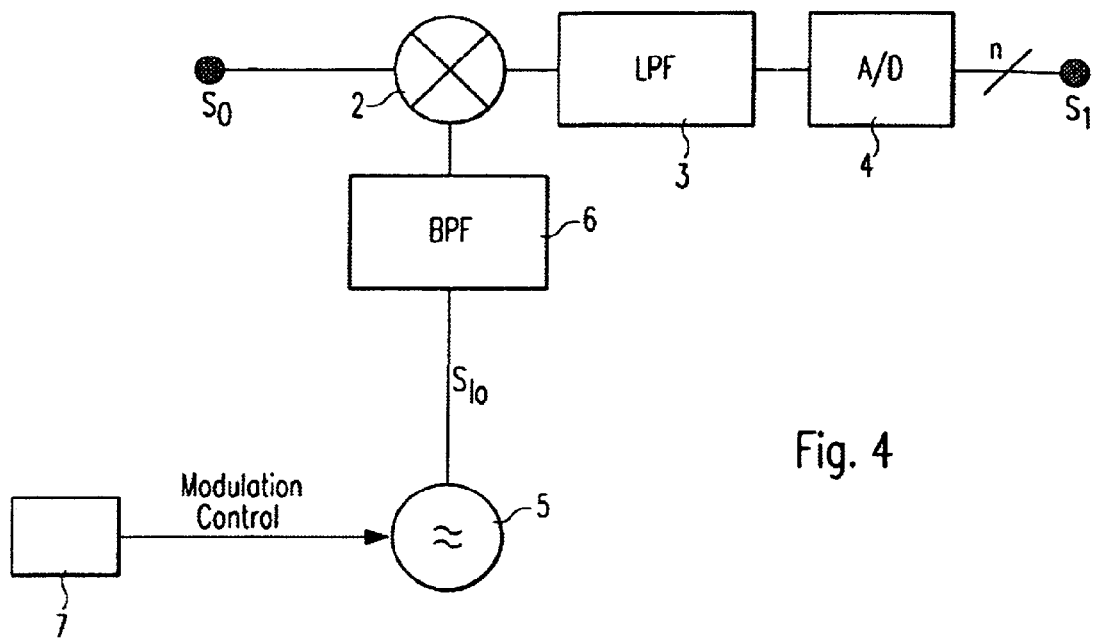
Figure 5:
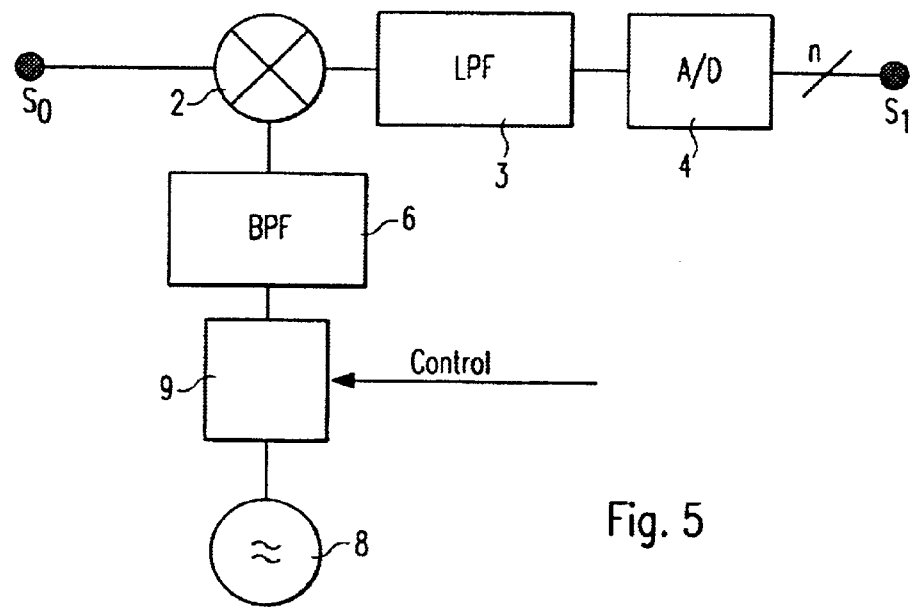
Figure 6:
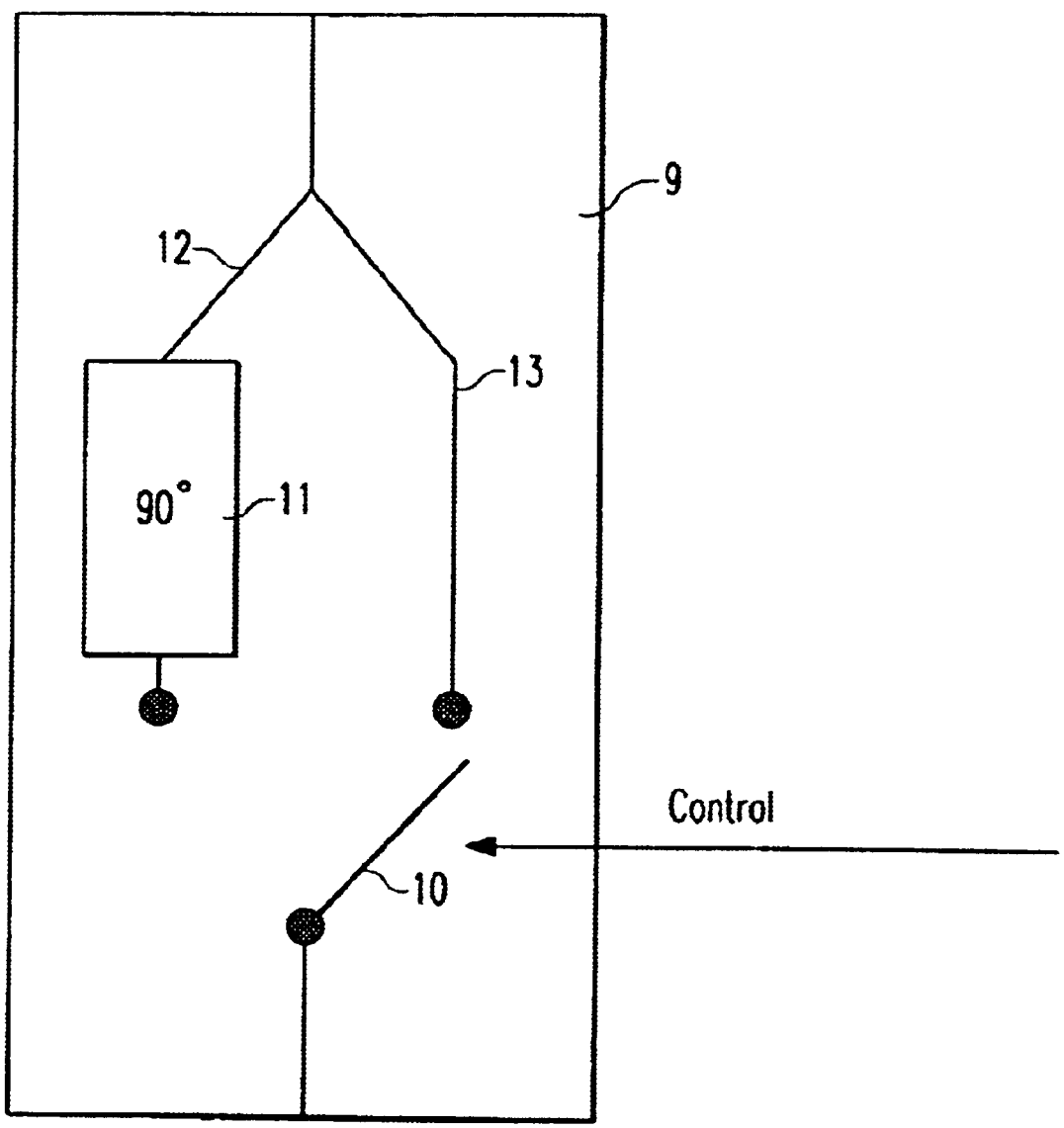
Figure 7:
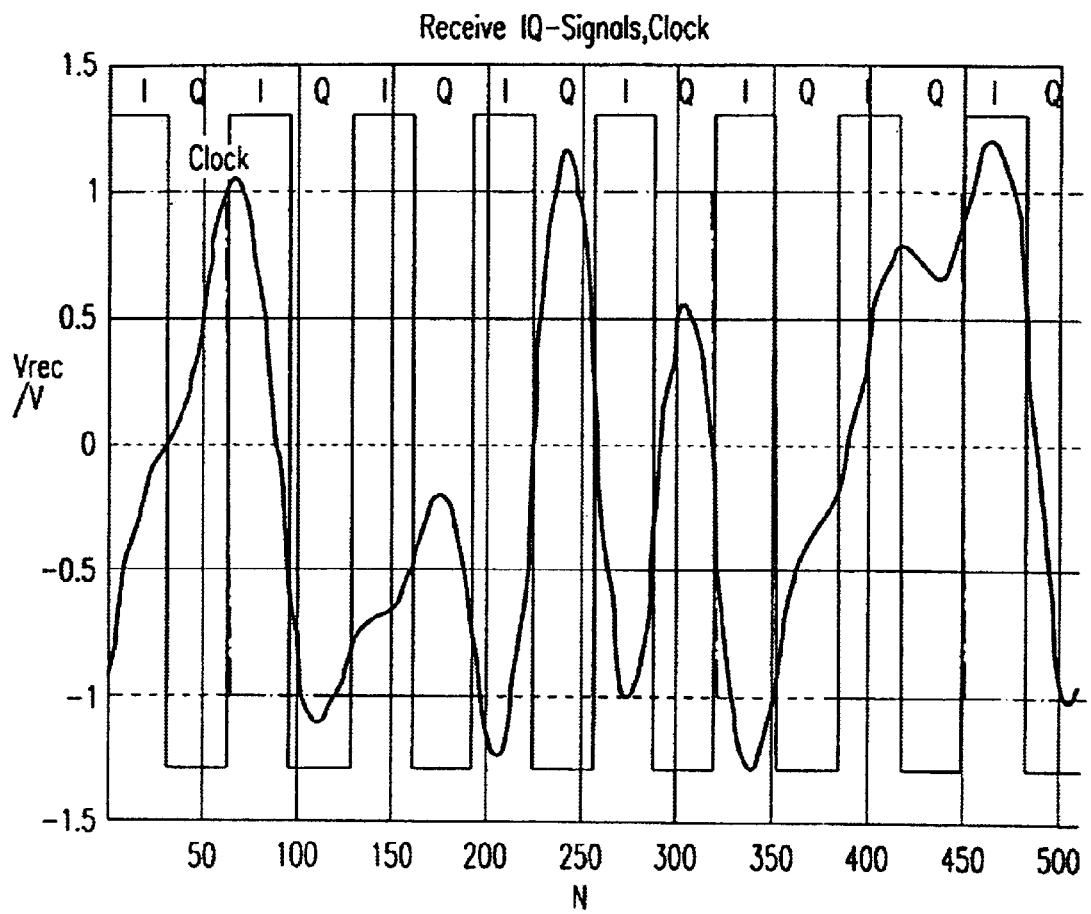
Figure 8:
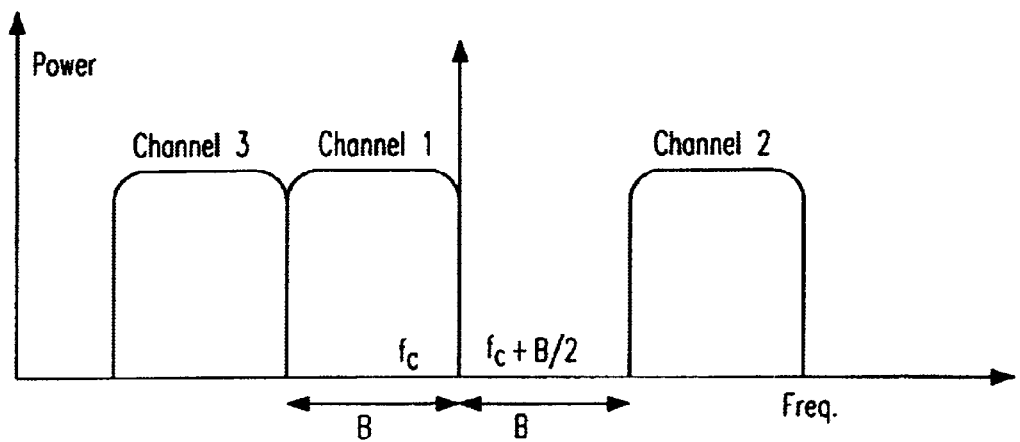
Figure 9:
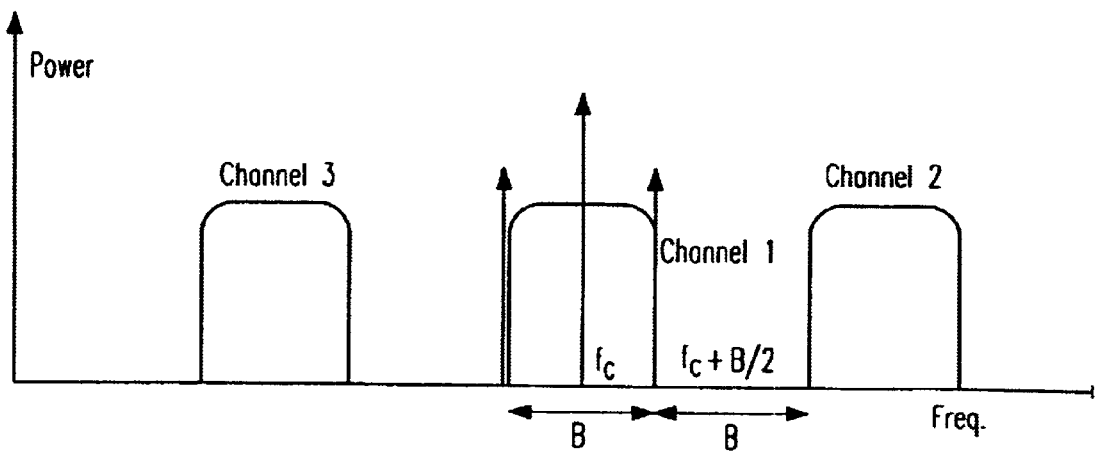

In the following description, the present invention is explained in more detail in relation to the enclosed drawings, in which FIG. 1 shows a schematic block diagram of a first embodiment of a demodulation structure according to the present invention, FIG. 2 shows the block diagram of FIG. 1 with additional representations of center frequencies and frequency bands of the signals in the different parts of the demodulation structure, FIG. 3 shows a simulation result for I/Q-values obtained for the modulation structure as shown in FIG. 1, FIG. 4 shows a schematic block diagram of a second embodiment of a demodulation structure according to the present invention, FIG. 5 shows a schematic block diagram of a third embodiment of a demodulation structure according to the present invention, FIG. 6 shows a more detailed representation of an analog circuit means comprised in the demodulation structure shown in FIG. 5, FIG. 7 shows a simulation result for I/Q-values obtained for a demodulation structure as shown in FIG. 4 or 5, FIG. 8 shows a schematic representation of center frequencies and frequency bands for a demodulation structure as shown in FIG. 1 in a multichannel environment, FIG. 9 shows a schematic representation of center frequencies and frequency bands for a demodulation structure as shown in FIG. 4 or 5 in a multichannel environment, and FIG. 10 shows a schematic block diagram of a demodulation structure according to the prior art.

The following description relates to the downconversion and demodulation of an I/Q-modulated signal. However, it is to be understood that the demodulation structures and methods shown in and explained in relation to the enclosed figures may be applied to the downconversion and demodulation of other digitally modulated signals.

FIG. 1 shows a schematic block diagram of a first embodiment of a demodulation structure for downconverting and demodulating an I/Q-modulated signal $S_0$. The I/Q-modulated modulated signal $S_0$ may e.g. be supplied from a HF part of a receiving device, e.g. comprised in a mobile terminal or a base station of a wireless telecommunication system. The demodulation structure shown in FIG. 1 comprises a local oscillator means 1 for generating a local oscillator signal $S_{lo}$. The local oscillator signal provided from the local oscillator means 1 has a center frequency $f_{lo}$ which, in respect to the center frequency $f_c$ of the I/Q-modulated signal $S_0$ in the respective signal band, is offset by half of the signal bandwidth of the I/Q-modulated signal $S_0$. $S_0$ is e.g. part of a high frequency band or an intermediate frequency band depending if a received high frequency signal is downconverted before being supplied to the demodulation structure shown in FIG. 1 or not.

Schematic representations of the frequency bands and center frequencies of the I/Q-modulated signal $S_0$ and the local oscillator signal $S_{lo}$ are shown in FIG. 2. Assuming that the I/Q-modulated signal $S_0$ has a signal bandwidth B and a center frequency $f_c$, the center frequency $f_{lo}$ of the local oscillator signal $S_{lo}$ may e.g. be located on the upper end of the signal band of the I/Q-modulated signal $S_0$, so that the center frequency $f_{lo}$ of the local oscillator signal $S_{lo}$ is equal to $f_c+B/2$. Alternatively, the center frequency $f_{lo}$ of the local oscillator signal $S_{lo}$ may be located at the lower edge of the signal band of the I/Q-modulated signal $S_0(f_{lo}=f_c-B/2)$.

The local oscillator signal $S_{lo}$ and the I/Q-modulated signal $S_0$ are mixed in a single mixer means 2 in order to obtain a mixed signal, which is lowpass filtered in a lowpass filter means 3 so that a baseband signal with a cutoff frequency B corresponding to the signal bandwidth of the I/Q-modulated signal $S_0$ is obtained. The filtered signal output from the lowpass filter means 3 is supplied to an analog-to-digital converter 4 for an analog-to-digital conversion at a sampling rate of twice the symbol rate of the I/Q-modulated signal $S_0$. In other words, the sampling is performed twice per symbol length of the I/Q-modulated signal $S_0$. However, a flip in the sign of the sampled I- and Q-values from clock cycle to clock cycle occurs so that some further processing in this respect is required.

Considering the case that the local oscillator signal $S_{lo}$ has a center frequency of $f_{lo}=f_c+B/2$, the operation of the demodulation structure shown in FIG. 1 and FIG. 2 is explained. The I/Q-modulated signal $S_0$ can be represented by:

$$s(t)=i(t)\cos(\omega_c t)+q(t)\sin(\omega_c t)$$

whereby $\omega_c=2\pi f_c$ and $i(t)$ and $q(t)$ are a baseband I signal and Q signal, respectively. They should be filtered such that symbol interference is avoided. In the mixer means 2, the I/Q-modulated signal $S_0$ is multiplied with the local oscillator signal $S_{lo}$ having a center frequency $f_{lo}=f_c+B/2$, so that the following mixed signal is obtained:

$$\begin{aligned}s_r(t) &= s_{lo}(t)*s_0(t) = a\cos((\omega_c+\pi B)t)*s_0(t)\\&= ai(t)\cos((\omega_c+\pi B)t)\cos(\omega_c t)+aq(t)\cos((\omega_c+\pi B)t)\sin(\omega_c t)\\&= \frac{a}{2}i(t)[\cos(\pi Bt)+\cos((2\omega_c+\pi B)t)]+\\&\quad \frac{a}{2}q(t)[\sin(\pi Bt)+\sin((2\omega_c+\pi B)t)]\end{aligned}$$

After filtering out the higher frequency component in the lowpass filter means 3, the low frequency component is obtained:

$$s(t)=\frac{a}{2}i(t)\cos(\pi Bt)+\frac{a}{2}q(t)\sin(\pi Bt)$$

By sampling at discrete points in time at $t=n/2B$, either the cosinus or the sinus function is zero, so that $i(n/2B)$ and $q(n/2B)$ can be extracted at either sample. Since the sampling rate $f_s$ is twice the symbol rate ($f_s=2B$), the lowpass filter means 3 must have a corner or a cutoff frequency of at least B. The signal output from the analog-to-digital converter means 4 (signal $S_1$) then serially comprises the I part and the Q part within each symbol period of the I/Q-modulated signal.

In FIG. 3 the signals versus time are depicted in a simulation result. Here, the clock is indicated by hairlines and the original I (dashed) and Q (dash-dotted) signals are also shown as ideal rectangular signals in parallel. At last, the demodulated analog signal (thick line) is shown, where I and Q at different halves of each clock cycle indicate whether the I or the Q signal can be picked up at this time. The additional sign "−" indicates a flip in the sign of the value due to the theory of operation. As an example the first two clock cycles are considered. In the first half the value of the downconverted signal is high leading to a "1" for the I-value. In the second half the value is still high, but due to an a-priory known change in the sign we yield "−1" as the Q-value. Third half: analog value high, which equals "−1" for I (because of minus sign) and at last again "−1" for Q (low analog value, no minus sign) and so forth. Thus, we obtain the serial sequence 1−1−1−1 . . . or as usual I=1−1 . . . and Q=−1−1 . . . in parallel. For simplicity in this example we have only used QPSK modulation, but higher order modulation schemes should equally be possible. The correct analog I- and Q-values or parts serially comprised in the output signal $S_1$ are available at the timepoints $(\frac{1}{4}+n/2)*T_s$, whereby n is the sample number and $T_s=\frac{1}{2}B$, so that the I part is obtained for even n and the Q part is obtained for odd n.

FIG. 4 shows a schematic block diagram of a second embodiment of a demodulation structure according to the present invention. The entire structure comprises a local oscillator means 5 generating and outputting a local oscillator signal $S_{lo}$, which is modulated by means of a modulation signal generated and output by a modulation control means 7. The local oscillator signal $S_{lo}$ is modulated with at least two modulation states with different phases. Preferably, the second modulation state has the same magnitude and the 90 degree phase shift in relation to the first modulation state, whereby the modulation states are changing alternatively, as e.g. 010101 . . . , whereby at least two modulation states have to be within one symbol period of the I/Q-modulated signal $S_0$. The center frequency $f_c$ of the local oscillator signal $S_{lo}$ is directly in the middle of the signal band of the I/Q-modulated signal $S_0$. The modulated local oscillator signal $S_{lo}$ is supplied to a bandpass filter means 6. The bandpass filter means 6 has advantageously a bandwidth of at least B and most advantageously 2B, whereby B is the signal bandwidth of the signal band of the I/Q-modulated signal $S_0$.

The output signal from the bandwidth filter means 6 is supplied to a mixer means 2, in which the bandpass filtered and modulated local oscillator signal $S_{lo}$ is multiplied with the I/Q-modulated signal $S_0$. The demodulation structure shown in FIG. 4 further comprises a lowpass filter means 3 and an analog-to-digital converter means 4. The mixer means 2, the lowpass filter means 3 and the analog-to-digital converter means 4 have the same function as shown and explained in relation to the first embodiment shown in FIG. 1 and explained in relation to FIGS. 1, 2 and 3, so that the explanation of the function thereof is omitted. The analog-to-digital converter means 4 outputs the output signal $S_1$ comprising the I part and the Q part in a serial arrangement.

FIG. 5 shows a block diagram of a third embodiment of a demodulation structure according to the present invention, which is similar to the second embodiment shown in FIG. 4. In contrary to the second embodiment shown in FIG. 4, in which the local oscillator signal $S_{lo}$ is internally modulated, the local oscillator signal of the third embodiment shown in FIG. 5 is externally modulated. The demodulation structure of the third embodiment comprises a local oscillator means 8 outputting a local oscillator signal being unmodulated and having a center frequency in the middle of the signal band of the I/Q-modulated signal $S_0$. The local oscillator signal is supplied to an analog circuit means 9 for modulating the local oscillator signal with two modulation states within one symbol period of the I/Q-modulated signal $S_0$ and outputting a modulated local oscillator signal to a bandpass filter means 6 corresponding to the bandpass filter means 6 of the second embodiment. The analog circuit means 9 modulates the local oscillator signal from the local oscillator means 8 with at least two different modulation states having different phase values. Preferably, the second modulation state has the same magnitude and is 90 degree phase shifted in relation to the first modulation state. Further preferably, the modulation states are changing alternatively twice as fast as the symbol rate of the I/Q-modulated signal $S_0$. An example for an analog circuit means 9 is schematically shown in FIG. 6. The analog circuit means 9 shown in FIG. 6 comprises a switch means 10 which can be switched by a control signal between a first branch 12 having a phase shift means 11 and a second branch 13 having no phase shift means. The control signal has a frequency of at least two times the symbol frequency of the I/Q-modulated signal $S_0$. The local oscillator signal supplied to the switch means 10 from the local oscillator means 8 is therefore switched between the first branch 12 and the second branch 13. Since the first branch 12 comprises a phase shift means 11, preferably causing a 90 degrees phase shift, the local oscillator means is modulated with the two modulation states having different phase values.

The third embodiment of the demodulation structure shown in FIG. 5 further comprises the mixture means 2, the lowpass filter means 3 and the analog-to-digital converter means 4 as the first and the second embodiment. Like in the first embodiment, the cutoff frequency of the lowpass filter means 3 and the sampling rate of the analog-to-digital converter 4 of the second and third embodiment have to be set according to the signal spectrum bandwidth at the input of the mixer means 2. The minimum requirements of the cutoff frequency of the lowpass filter means 3 is B (channel bandwidth or signal bandwidth of the I/Q-modulated signal $S_0$) and the sampling rate of the analog-to-digital converter 4 is $f_s=\frac{1}{2}B$.

In the demodulating structure of the second embodiment shown in FIG. 4, the local oscillator signal is internally modulated and in the demodulation structure of the third embodiment shown in FIG. 5, the local oscillator signal is externally modulated by passing through an analog circuit means 9. Hereby, a clock recovery or some other conventional synchronisation is employed to control the switch means 10 comprised in the analog circuit means 9. In the second embodiment and the third embodiment, the in-phase (I) component is downconverted in the first half of the clock cycle and the Q component is downconverted in the second half of the clock cycle. The local oscillator signal is then given by the following mathematical description:

$$s_{lo}(t) = \begin{cases} a\cos(\omega_c(t); & 0 < t/(nT) < 1/2 \\ a\sin(\omega_c t); & 1/2 < t/(nT) < 1 \end{cases}$$

whereby n is an integer value denoting the number of the respective symbol and T denotes the symbol time. Thus, the local oscillator signal needs to take two modulation states during one symbol of the I/Q-modulated signal $S_0$, which requires a wide band receiver with at least a bandwidth B as the bandpass filter 6. With this modulated local oscillator signal, the downconverted and lowpass filtered signal output by the lowpass filter means 3 is $$s(t) = \begin{cases} \frac{a}{2} i(t); & 0 < t/(nT) < 1/2 \\ \frac{a}{2} q(t); & 1/2 < t/(nT) < 1 \end{cases}$$ 5 and so the correct I part and Q part can be extracted at the respective time intervals.

However, because of the switching or the modulation of the local oscillator signal, the local oscillator signal would exhibit an infinite spectrum without the bandpass filter means 6. Since the local oscillator signal must have at least two modulation states during one symbol period, its spectrum has to be limited, advantageously to a bandwidth of 2B, in the bandpass filter means 6, which still allows a correct detection of the related I/Q-values. FIG. 7 shows a simulation result for the I/Q-values obtained for a demodulation structure according to the second or third embodiment, which shows the originally transmitted I/Q-values and the received I/Q-values similar to FIG. 3, to the description of which reference is made. However, in FIG. 7 it is to be noted that no sign flips in the I- and Q-values occur.

As can be seen from the above description, the demodulation structure and method for downconverting and demodulating a I/Q-modulated signal $S_0$ according to the present invention provide a simplified demodulated technique, which requires only one mixer, one lowpass filter and one analog-to-digital converter for generating the I and Q-parts. However, a local oscillator signal with a correspondingly adapted and predefined spectrum and a faster analog-to-digital conversion is required as compared to a prior art, as e.g. shown in FIG. 10. Particularly, since at least one analog phase shifter compared to the prior art can be omitted, and only a single mixer is necessary, amplitude and phase imbalances may be reduced significantly. Thus, the present invention provides a lower complexity and better I/Q imbalances behaviour as known demodulators.

In a multichannel environment, in which I/Q-modulated signals are transmitted in a plurality of channels, correct channel spacings need to be respected, which is explained in relation to FIGS. 8 and 9. FIG. 8 shows the minimum channel raster requirements for a demodulation structure according to the first embodiment shown in FIG. 1. Hereby, FIG. 8 only shows a theoretical setup, in which the center frequency of the local oscillator signal output from the local oscillator means 1 is placed on the high frequency edge of channel 1 and only channel 1 shall be demodulated. Thus, in order not to have channel interference, the upper channel 2 must be at a distance B above the frequency of the local oscillator signal. The lower channel 3 may be directly adjacent to channel 2, since all mixing products of channel 2 with the local oscillator signal are outside the baseband with a signal bandwidth B. However, the asymmetric ordering of the channels as shown in FIG. 8 is only a theoretical limit and will probably not be used in praxis. Thus, the channels must be at least the signal bandwidth B apart.

The same is true for the demodulation structure of the second and fourth embodiment. The corresponding situation is shown in FIG. 9, which shows that even in theory the lower channel 3 must be at least the signal bandwidth B apart from channel 1 for the reasons given above in relation to FIG. 8. Thus, the proposed demodulation scheme is well suited for applications in which the channel under consideration is extracted from the RF band before the I/Q-demodulation.

What is claimed is:

1. Demodulation structure for downconverting and demodulating a digitally modulated signal, comprising:
    a local oscillator means for providing a local oscillator signal,
    a mixer means for mixing said local oscillator signal and said digitally modulated signal in order to obtain a mixed signal,
    a low pass filter means for low pass filtering said mixed signal from said mixer means, and
    an analog-to-digital converting means for converting the filtered signal from said low pass filter means info a downconverted and demodulated digital signal,
    whereby said local oscillator signal is set in respect to said digitally modulated digital signal so that said downconverted and demodulated digital signal output from said analog-to-digital converting means comprises two serially arranged information parts, and
    wherein said digitally modulated signal is modulated in a signal band having a center frequency and said local oscillator signal has a center frequency, which is, in respect to said center frequency of the signal band, offset by half of the signal band width of the digitally modulated signal.

2. Demodulation structure according to claim 1, characterized in, that said digitally modulated signal is I/Q-modulated and said two serially arranged information parts comprised in said downconverted and demodulated digital signal are an I-part and a Q-part of the I/Q-modulated digital signal.

3. Demodulation structure for downconverting and demodulating a digitally modulated signal, comprising:
    a local oscillator means for providing a local oscillator signal,
    a mixer means for mixing said local oscillator signal and said digitally modulated signal in order to obtain a mixed signal,
    a low pass filter means for low pass filtering said mixed signal from said mixer means, and
    an analog-to-digital converting means for converting the filtered signal from said low pass filter means into a downconverted and demodulated digital signal,
    whereby said local oscillator signal is set in respect to said digitally modulated signal so that said downconverted and demodulated digital signal output from said analog-to-digital convening means comprises two serially arranged information parts whereby said local oscillator signal is modulated with at least two modulation states having different phases during the symbol period of the digitally modulated signal,
    a modulation control means for supplying a modulation signal to said local oscillator means in order to internally modulate the local oscillator signal with said at least two modulation states; and
    a band pass filter for band pass filtering said modulated local oscillator signal.

4. Demodulation structure according to claim 3, characterized in, that said band pass filter has a center frequency corresponding to the center frequency and a bandwidth corresponding to the bandwidth of the signal band of the digitally modulated signal.

5. Method for downconverting and demodulating a digitally modulated signal, comprising the steps of:
    providing a local oscillator signal,
    mixing said local oscillator signal and said digitally modulated signal in order to obtain a mixed signal, low pass filtering said mixed signal, and analog-to-digital converting the filtered signal into a downconverted and demodulated digital signal, whereby said local oscillator signal is set in respect to said digitally modulated signal so that said downconverted and demodulated digital signal comprises two serially arranged information parts, and wherein that said digitally modulated signal is modulated in a signal band having a center frequency and said local oscillator signal has a center frequency, which is, in respect to said center frequency of the signal band, offset by half of the signal band width of the digitally modulated signal.

6. Method according to claim 5, characterized in, that said digitally modulated signal is I/Q-modulated and said two serially arranged information parts comprised in said downconverted and demodulated digital signal are an I-part and a Q-part of the I/Q-modulated digital signal.

7. Method for downconverting and demodulating a digitally modulated signal, comprising the steps of:

providing a local oscillator signal, mixing said local oscillator signal and said digitally modulated signal in order to obtain a mixed signal, low pass filtering said mixed signal, analog-to-digital converting the filtered signal into a downconverted and demodulated digital signal, whereby said local oscillator signal is set in respect to said digitally modulated signal so that said downconverted and demodulated digital signal comprises two serially arranged information parts, whereby said local oscillator signal is modulated with at least two modulation states having different phases during the symbol period of the digitally modulated signal, whereby the local oscillator signal is internally modulated with said at least two modulation states by means of a supplied modulation signal, and whereby said two different modulation states have the same magnitude and a 90 degree phase shift in respect to each other, and further comprising the step of band pass filtering said modulated local oscillator signal.

8. Method according to claim 7, characterized in, that said band pass filter step uses a center frequency corresponding to the center frequency fc and a bandwidth corresponding to the bandwidth of the signal band of the digitally modulated signal.

* * * * *